US012581945B2

(12) United States Patent
Cheng et al.

(10) Patent No.: US 12,581,945 B2
(45) Date of Patent: Mar. 17, 2026

(54) ISOLATED POWER CHIP BASED ON WAFER LEVEL PACKAGING AND METHOD OF MANUFACTURING THE SAME

(71) Applicant: University Of Science And Technology Of China, Hefei (CN)

(72) Inventors: Lin Cheng, Hefei (CN); Dongfang Pan, Hefei (CN)

(73) Assignee: University Of Science And Technology Of China, Hefei (CN)

( * ) Notice: Subject to any disclaimer, the term of this patent is extended or adjusted under 35 U.S.C. 154(b) by 524 days.

(21) Appl. No.: 18/257,484

(22) PCT Filed: Dec. 18, 2020

(86) PCT No.: PCT/CN2020/137545
§ 371 (c)(1),
(2) Date: Jun. 14, 2023

(87) PCT Pub. No.: WO2022/126583
PCT Pub. Date: Jun. 23, 2022

(65) Prior Publication Data
US 2024/0014126 A1     Jan. 11, 2024

(51) Int. Cl.
*H01L 29/00*     (2006.01)
*H01L 23/00*     (2006.01)
(Continued)

(52) U.S. Cl.
CPC .... *H01L 23/5227* (2013.01); *H01L 23/49816* (2013.01); *H01L 23/49822* (2013.01);
(Continued)

(58) Field of Classification Search
CPC ........... H01L 23/5227; H01L 23/49816; H01L 23/49822; H01L 23/5223; H01L 24/48;
(Continued)

(56) References Cited

U.S. PATENT DOCUMENTS

| | | | | |
|---|---|---|---|---|
| 2015/0069636 A1* | 3/2015 | Chow | .................. | H04B 5/22 257/777 |
| 2018/0159433 A1 | 6/2018 | Oe et al. | | |
| 2024/0170205 A1* | 5/2024 | Sato | .................. | H01L 24/49 |

FOREIGN PATENT DOCUMENTS

| | | |
|---|---|---|
| CN | 1877976 A | 12/2006 |
| CN | 104022113 A | 9/2014 |
| CN | 111224538 A | 6/2020 |

OTHER PUBLICATIONS

"International Application Serial No. PCT/CN2020/137545, International Search Report dated Sep. 18, 2021", w/ English Translation, (Sep. 18, 2021), 5 pgs.
(Continued)

*Primary Examiner* — Theresa T Doan
(74) *Attorney, Agent, or Firm* — Schwegman Lundberg & Woessner, P.A.

(57)     ABSTRACT

An isolated power chip based on wafer level packaging, including: an RDL-based micro-transformer, where a primary coil of the RDL-based micro-transformer is connected to a direct-current power supply and configured to output a direct-current voltage input by the direct-current power supply; a transmitting chip connected to the primary coil of the RDL-based micro-transformer, and configured to receive the direct-current voltage, convert the direct-current voltage into an alternating current signal, and transmit the alternating current signal to a secondary coil of the RDL-based micro-transformer; and a receiving chip connected to the secondary coil of the RDL-based micro-transformer, and configured to convert the alternating current signal into a direct-current signal, generate a control signal for stabilizing the output voltage according to a change of a load, and encode the control signal for digital isolation. The present disclosure further provides a method of manufacturing an isolated power chip based on wafer level packaging.

10 Claims, 4 Drawing Sheets

(51) Int. Cl.

| | |
|---|---|
| *H01L 23/498* | (2006.01) |
| *H01L 23/522* | (2006.01) |
| *H01L 25/065* | (2023.01) |
| *H02M 3/00* | (2006.01) |
| *H02M 3/335* | (2006.01) |

(52) U.S. Cl.
CPC .......... *H01L 23/5223* (2013.01); *H01L 24/48* (2013.01); *H01L 25/0655* (2013.01); *H02M 3/003* (2021.05); *H02M 3/33569* (2013.01); *H01L 2224/48091* (2013.01); *H01L 2224/48132* (2013.01); *H01L 2224/48139* (2013.01); *H01L 2924/14252* (2013.01); *H01L 2924/18161* (2013.01)

(58) Field of Classification Search
CPC ....... H01L 25/0655; H01L 2224/48132; H01L 2224/48139; H01L 2924/14252; H01L 23/3128; H01L 23/642; H01L 23/66; H01L 23/5389; H01L 21/50; H01L 25/16; H02M 3/003; H02M 3/33569; H02M 1/0048; H02M 3/33523
USPC ....................................................... 257/531
See application file for complete search history.

(56) References Cited

OTHER PUBLICATIONS

"International Application Serial No. PCT/CN2020/137545, Written Opinion dated Sep. 18, 2021", (Sep. 18, 2021), 5 pgs.

* cited by examiner

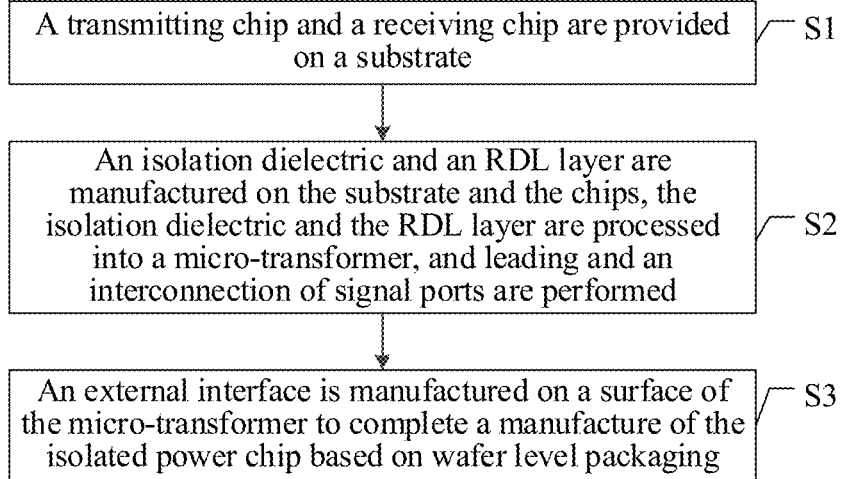

A transmitting chip and a receiving chip are provided on a substrate — S1

An isolation dielectric and an RDL layer are manufactured on the substrate and the chips, the isolation dielectric and the RDL layer are processed into a micro-transformer, and leading and an interconnection of signal ports are performed — S2

An external interface is manufactured on a surface of the micro-transformer to complete a manufacture of the isolated power chip based on wafer level packaging — S3

FIG. 6

ISOLATED POWER CHIP BASED ON WAFER LEVEL PACKAGING AND METHOD OF MANUFACTURING THE SAME

PRIORITY APPLICATIONS

This application is a U.S. National Stage Filing under 35 U.S.C. § 371 from International Application No. PCT/CN2020/137545, filed on Dec. 18, 2020, and published as WO2022/126583 on Jun. 23, 2022; the benefit of priority of which is hereby claimed herein, and which application and publication is hereby incorporated herein by reference in its entirety.

TECHNICAL FIELD

The present disclosure relates to a field of isolated power supply technology, and in particular, to an isolated power chip based on wafer level packaging and a method of manufacturing the isolated power chip based on wafer level packaging.

BACKGROUND

An application range of an isolated power chip is very wide, especially when a device needs to operate under some extreme conditions, the isolated power chip plays an important role in ensuring a safety and reliability of the device. In order to achieve a safe and reliable communication between two points, it is necessary to isolate the two points from each other, without interfering with each other, and transmit energy in a unidirectional manner to prevent an existence of a direct current and a ground loop, so as to ensure a safety of human body and the device.

Existing isolated power supplies have problems such as low efficiency, large size, high electromagnetic noise and high cost. Therefore, it is still challenging to efficiently transmit hundreds of milliwatts of power through isolated devices in applications where size and cost are constrained. Different from the existing optocoupler isolated devices, a fully integrated isolated power chip based on a micro-transformer has advantages of good isolation performance, high magnetic immunity, small size, and monolithic integration.

In summary, existing isolated power supplies have high packaging cost, low power density, low conversion efficiency, and adverse effects of parasitic inductances caused by bonding wires on electrical performances of a system. Therefore, how to achieve greater transmission efficiency and output power under a constraint of chip size so as to improve power density is an urgent problem to be solved.

SUMMARY

The present disclosure provides an isolated power chip based on wafer level packaging, including:

a Redistributable layer (RDL)-based micro-transformer, wherein a primary coil of the RDL-based micro-transformer is connected to a direct-current power supply and configured to output a direct-current voltage input by the direct-current power supply;

a transmitting chip connected to the primary coil of the RDL-based micro-transformer, and configured to receive the direct-current voltage, convert the direct-current voltage into an alternating current signal, and transmit the alternating current signal to a secondary coil of the RDL-based micro-transformer; and a receiving chip connected to the secondary coil of the RDL-based micro-transformer, and configured to convert the alternating current signal into a direct-current signal, generate a control signal for stabilizing the output voltage according to a change of a load, and encode the control signal for digital isolation.

Optionally, the RDL-based micro-transformer includes:

the primary coil processed based on the RDL;

the secondary coil processed based on the RDL; and an interconnection line, including:

an interconnection line leaded from a side of the primary coil, connected to a port of the transmitting chip and manufactured based on the RDL, and an interconnection line leaded from a side of the secondary coil, connected to a port of the receiving chip and manufactured based on the RDL.

Optionally, a coil winding structure of the primary coil is a single helix or a double helix, and a coil winding structure of the secondary coil is a single helix or a double helix; the primary coil and the secondary coil are in a same plane or correspond to different planes stacked in parallel; and a coil winding shape of the primary coil and a coil winding shape of the secondary coil include: a circle, an ellipse, a rectangle, a regular N-gon, where N≥4.

Optionally, the transmitting chip 200 includes:

a cross-coupled oscillator; and a decoding circuit, configured to decode an encoded control signal into a switch signal to control the cross-coupled oscillator to be turned on or turned off.

Optionally, the cross-coupled oscillator includes:

a first MOS transistor and a second MOS transistor, wherein a gate of the first MOS transistor is connected to a drain of the second MOS transistor through a first voltage-dividing capacitor, and a gate of the second MOS transistor is connected to a drain of the first MOS transistor through a second voltage-dividing capacitor;

a direct-current bias voltage, wherein one terminal of the direct-current bias voltage is connected to the gate of the first MOS transistor through a first bias resistor; and the other terminal of the direct-current bias voltage is connected to the gate of the second MOS transistor through a second bias resistor; and a switch MOS transistor, wherein a drain of the switch MOS transistor is connected to a source of the first MOS transistor and a source of the second MOS transistor, a source of the switch MOS transistor is grounded, and a gate of the switch MOS transistor is connected to an output terminal of the decoding circuit.

Optionally, the receiving chip includes: a rectification circuit, and a feedback control circuit, wherein the feedback control circuit includes:

a feedback controller configured to generate the control signal for stabilizing the output voltage according to a change of a sampled output voltage and encode the control signal; and a digital transformer, wherein an encoded control signal is transmitted in digital isolation through an input port of the digital transformer, and another input port of the digital transformer is a second grounding terminal, wherein a first output port of the digital transformer is connected to the transmitting chip through the RDL, and a second output port of the digital transformer is connected to a first grounding terminal.

A control mode adopted by the feedback controller includes: a control mode based on a pulse-width modulation, a control mode based on a pulse-frequency modulation, or a combination of the control mode based on the pulse-width modulation and the control mode based on the pulse-frequency modulation.

Another aspect of the present disclosure provides a method of manufacturing any isolated power chip based on wafer level packaging described above, and the method includes:

an operation S1, including providing a transmitting chip and a receiving chip on a substrate;

an operation S2, including manufacturing an isolation dielectric and an RDL layer on the substrate and the chips, processing the isolation dielectric and the RDL layer into a micro-transformer, and performing leading and an interconnection of signal ports; and an operation S3, including manufacturing an external interface on a surface of the micro-transformer to complete a manufacture of the isolated power chip based on wafer level packaging.

Optionally, the providing includes grooving the substrate and embedding the chips into a groove, or attaching the chips to an outer surface of the substrate; and a material of forming the substrate is selected from glass, silicon, or FR4.

Optionally, a material of forming the RDL layer is selected from copper, aluminum, or gold.

Optionally, a material of forming the isolation dielectric layer is selected from glass, silicon, FR4, polyimide, epoxy resin, or plastic.

Optionally, the RDL layer includes at least one wiring layer, wherein the primary coil of the micro-transformer, the secondary coil of the micro-transformer, and the interconnection structure of the micro-transformer are manufactured through respective wiring layers.

Optionally, the RDL layer includes a first wiring layer, a second wiring layer and a third wiring layer, the primary coil of the micro-transformer is manufactured through the first wiring layer; and the secondary coil of the micro-transformer is manufactured through the third wiring layer, a plurality of first via holes are provided between the chips and the first wiring layer on the chips, a plurality of second via holes are provided between the second wiring layer and the first wiring layer and between the second wiring layer and the primary coil, and a plurality of third via holes are provided between the second wiring layer and the third wiring layer and between the second wiring layer and the secondary coil, the primary coil is connected to the second wiring layer through the second via hole, and the primary coil is connected to a port of the transmitting chip through the first via hole, and the secondary coil is connected to the second wiring layer through the third via hole, and the secondary coil is connected to a port of the receiving chip through the second via hole and the first via hole.

Different from an existing isolated power chip and a method of manufacturing the existing isolated power chip, in the present disclosure, for the isolated power chip based on wafer level packaging and the method of manufacturing the same, a packaging size is reduced, thereby improving power density; a wafer level packaging process is adopted, thereby reducing costs; an RDL micro-transformer based on the glass substrate may achieve higher coupling coefficient; through thick metal and wide linewidth RDLs, higher Q values can be achieved than transformers using downstream silicon-based processes, thereby improving a power conversion efficiency of the isolated power supply; and an RDL wiring in the packaging replaces a gold wire bonding, thereby effectively shortening a return path from the power supply to the ground, avoiding instability of the system caused by bonding wires, and reducing some electromagnetic noises.

BRIEF DESCRIPTION OF THE DRAWINGS

Accompanying drawings are used to provide a further understanding of the present disclosure and constitute a part of the description, and are used to explain the present disclosure with specific embodiments below, but are not constituted a limitation on the present disclosure, in which:

FIG. 6 shows a schematic diagram of a process of manufacturing an isolated power chip based on wafer level packaging according to an embodiment of the present disclosure.

REFERENCES SIGNS

40—Substrate; 50—Isolation dielectric; 60—Solder ball; 100—Micro-transformer; 200—Transmitting chip; 210—Cross-coupled oscillator; 220—Decoding circuit; 300—Receiving chip; 310—Rectification circuit; 320—Feedback control circuit; 321—Feedback controller; 322—Digital Transformer; $V_{DD}$—Direct-current power supply; $V_B$—Direct-current bias voltage; GND1—First grounding terminal; GND2—Second grounding terminal; $L_P$—Primary coil; $L_S$—Secondary coil; $TX_P$, $TX_N$—Ports of transmitting chip; $RX_P$, $RX_N$—Ports of receiving chip; $V_{C1}$—Input port of decoding circuit; $V_{C2}$—First output port of digital transformer; $V_{ISO}$—Output voltage; V1—First via hole; V2—Second via hole; V3—Third via hole; V4—Fourth via hole.

DETAILED DESCRIPTION OF EMBODIMENTS

The present disclosure provides an isolated power chip based on wafer level packaging and a method of manufacturing the same. For the isolated power chip based on wafer level packaging, a wafer level packaging method is adopted, a transmitting chip, a receiving chip and an RDL-based micro-transformer are embedded and integrated on a substrate, thereby reducing costs, reducing a packaging size, and improving a power density of an isolated power supply; the isolated power supply does not use a single transformer chip, but uses a micro-transformer manufactured based on the RDL design in packaging; through a compact structure of RDL and high-performance metal lines, a Q value and a coupling coefficient of the RDL-based micro-transformer may be improved, so as to improve a transmission efficiency of the transformer, thereby improving a power conversion efficiency of the isolated power supply; and by replacing an existing gold wire bonding with an RDL interconnection, the packaging size is further reduced, thereby avoiding instability of the system caused by the parasitic inductance which is caused by bonding wires, and shortening a return path from the power supply to the ground to reduce some electromagnetic noises.

Figure 1:
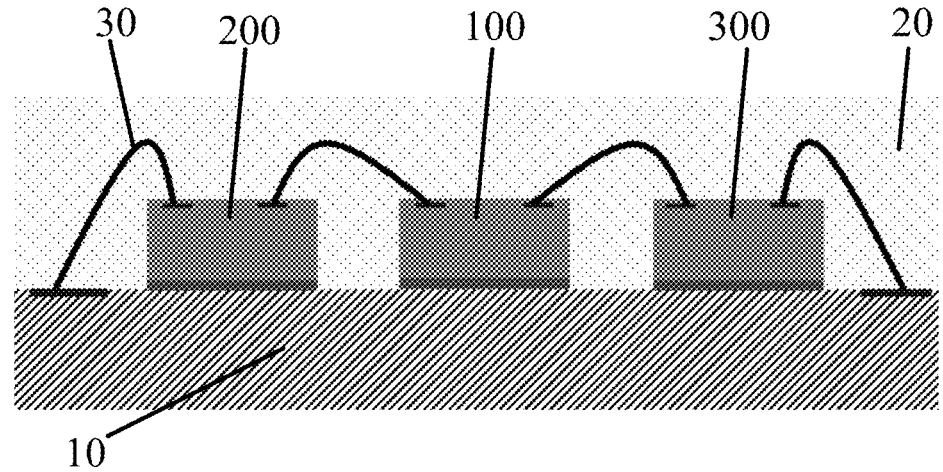
FIG. 1 shows a side view of a packaging structure of an existing fully integrated isolated power chip.

In a process of implementing the present disclosure, the inventors found that a core device that limits an efficiency of a fully integrated isolated power chip is a chip transformer. Under high-frequency operating conditions, the quality factor (Q) of the transformer is reduced due to an increase of an exposure of the substrate, so as to reduce the efficiency of the transformer. At present, an implementation scheme of the fully integrated isolated power chip [Reference: W. Qin et al., "An 800 mW Fully Integrated Galvanic Isolated Power Transfer System Meeting CISPR 22 Class-B Emission Levels with 6 dB Margin," 2019 IEEE International Solid State Circuits Conference—(ISSCC), San Francisco, CA, USA, 2019], is shown as FIG. 1. In the scheme, a plurality of chips are combined to package, the chips include a transformer chip 100 manufactured using the downstream silicon-based processes, a transmitting chip 200 manufactured using a high-voltage BCD process, and a receiving chip 300 manufactured using a high-voltage BCD process. A plurality of bare chips are interconnected and packaged in a packaging substrate 10 and a plastic filling 20 through gold wire bonding 30. A form of SOIC (Small Outline Integrated Circuit) plastic packaging is adopted and the packaging size is large, such that power density of the isolated power chip is low. For the micro-transformer chip manufactured using additional downstream process, the exposure of the substrate is large, and the transformer has a high loss and a low Q value, which leads to a low output power and a low conversion efficiency of the isolated power chip. The gold wire bonding is adopted for interconnection, which causes the instability of the system due to the parasitic inductance caused by bonding wires, introduces more electromagnetic noises, and increases the packaging size. With a development of wafer level packaging technology, the plurality of bare chips are interconnected through redistributable layers, so as to effectively reduce the packaging size, thereby reducing costs and effectively improving the reliability of the system as the existing gold wire bonding interconnection method is not required. A technology of integrating the plurality of bare chips on a single package under a smaller size condition is achieved. Therefore, the present disclosure provides the isolated power chip based on wafer level packaging and the transformer of the isolated power chip based on wafer level packaging, so as to achieve greater transmission efficiency and greater output power, and improve power density under the constraint of the size of the chip.

The technical solutions of the present disclosure will be clearly and completely described below with reference to embodiments and accompanying drawings of the embodiments. It is clearly that the described embodiments are only some, but not all, embodiments of the present disclosure. Based on the embodiments in the present disclosure, all other embodiments obtained by those of ordinary skilled in the art without creative efforts shall fall within the protection scope of the present disclosure.

6

Figure 2:
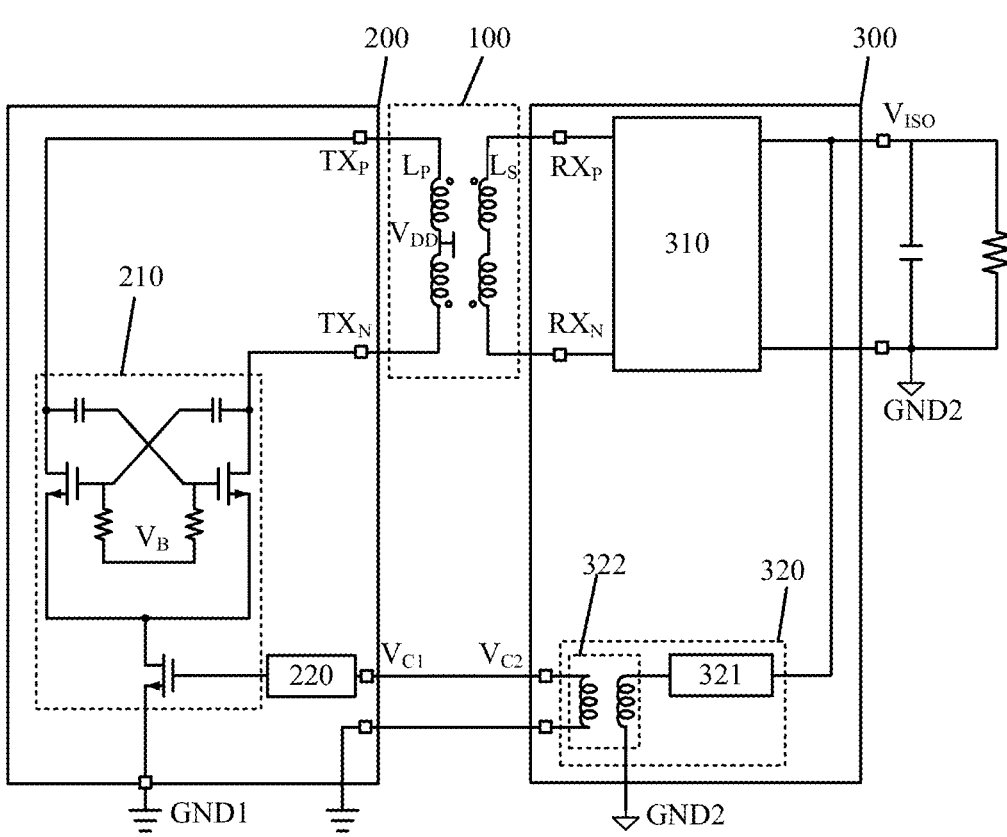
FIG. 2 shows a block diagram of a system composition of an isolated power chip based on wafer level packaging according to an embodiment of the present disclosure.
Figure 4A:
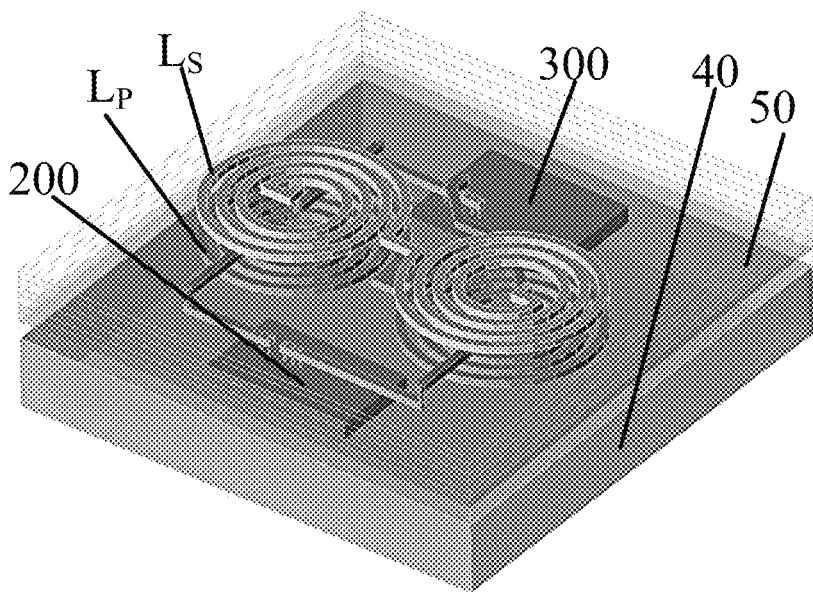
FIG. 4a shows a schematic three-dimensional structural diagram of an isolated power chip based on wafer level packaging according to an embodiment of the present disclosure.
Figure 4B:
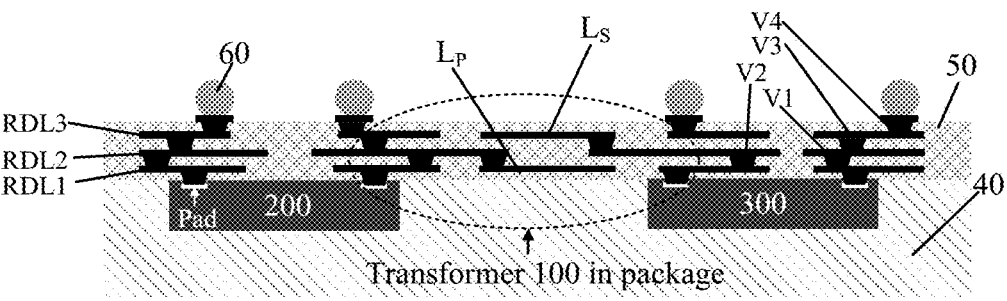
FIG. 4b shows a schematic structural side view of an isolated power chip based on wafer level packaging according to an embodiment of the present disclosure.

In embodiments of the present disclosure, an isolated power chip based on wafer level packaging is provided, as shown in FIG. 2, FIG. 4a, and FIG. 4b, the isolated power chip includes: an RDL-based micro-transformer having a primary coil connected to a direct-current power supply and used to output a direct-current voltage input by the direct-current power supply; a transmitting chip connected to the primary coil of the RDL-based micro-transformer, and used to receive the direct-current voltage and convert the direct-current voltage into an alternating current signal, transmit the alternating current signal to a secondary coil of the RDL-based micro-transformer; and a receiving chip connected to the secondary coil of the RDL-based micro-transformer, and used to convert the alternating current signal into a direct-current signal, generate a control signal for stabilizing the output voltage according to a change of a load, and encode the control signal for digital isolation.

The primary coil of the RDL-based micro-transformer 100 is connected to the transmitting chip, and the secondary coil of the RDL-based micro-transformer 100 is connected to the receiving chip, as an isolated device for transmitting an alternating current oscillating power signal.

The primary coil of the RDL-based micro-transformer and the secondary coil of the RDL-based micro-transformer are processed based on RDL. A coil winding structure of the primary coil is a single helix or a double helix, and a coil winding structure of the secondary coil is a single helix or a double helix. The primary coil and the secondary coil are in a same plane or correspond to different planes stacked in parallel. A coil winding shape of the primary coil and a coil winding shape of the secondary coil include: a circle, an ellipse, a rectangle, a regular N-gon, where N≥4. An interconnection line includes an interconnection line leaded from a side of the primary coil, connected to a port of the transmitting chip and manufactured based on the RDL, and an interconnection line leaded from a side of the secondary coil, connected to a port of the receiving chip and manufactured based on the RDL.

The RDL-based micro-transformer 100 includes: a primary coil $L_P$, in a form of a planar double helix; a secondary coil $L_S$, in a form of a planar double helix, and corresponding to the primary coil stacked in parallel to the secondary coil; and an interconnection line, including: an interconnection line (connected to a first grounding terminal GND1) leaded from a side of the primary coil $L_P$, connected to ports ($TX_P$ and $TX_N$) of the transmitting chip, and an interconnection line (connected to a second grounding terminal GND2) leaded from a side of the secondary coil $L_S$, connected to ports ($RX_P$ and $RX_N$) of the receiving chip.

The transmitting chip 200 includes: a cross-coupled oscillator 210 and a decoding circuit 220.

The decoding circuit 220 decodes an encoded control signal (narrow pulse) into a switch signal to drive a switch MOS transistor to control the cross-coupled oscillator 210 to be turned on or turned off.

The cross-coupled oscillator 210 includes: a first MOS transistor and a second MOS transistor, where a gate of the first MOS transistor is connected to a drain of the second MOS transistor through a first voltage-dividing capacitor, and a gate of the second MOS transistor is connected to a drain of the first MOS transistor through a second voltage-dividing capacitor; a direct-current bias voltage $V_B$, where one terminal of the direct-current bias voltage is connected to the gate of the first MOS transistor through a first bias resistor, and the other terminal of the direct-current bias voltage is connected to the gate of the second MOS transistor through a second bias resistor; and a switch MOS transistor, where a drain of the switch MOS transistor is connected to a source of the first MOS transistor and a source of the second MOS transistor, a source of the switch MOS transistor is grounded, and a gate of the switch MOS transistor is connected to an output terminal of the decoding circuit.

The receiving chip 300 includes a rectification circuit 310 and a feedback control circuit 320.

The feedback control circuit 320 includes: a feedback controller 321 used to generate the control signal for stabilizing the output voltage according to a change of a sampled output voltage and encode the control signal; and a digital transformer 322, where an encoded control signal is transmitted in digital isolation through a first input port of the digital transformer, another input port of the digital transformer is the second grounding terminal GND2, a first output port $V_{C2}$ of the digital transformer 322 is connected to an input terminal $V_{C1}$ of the decoding circuit 220 through the RDL, and a second output port of the digital transformer is connected to the first grounding terminal GND1.

A control mode commonly adopted by the feedback controller includes: a control mode based on a Pulse-width modulation (PWM), a control mode based on a Pulse-frequency modulation (PFM), or a combination of the control mode based on the Pulse-width modulation and the control mode based on the Pulse-frequency modulation.

In order to save area and cost, preferably, the digital transformer 322 may be manufactured as a planar transformer on a chip through a top-layer thick metal and a sub-top-layer thick metal.

In summary, the transmitting chip 200 inverts the input direct-current voltage that is output by the direct-current power supply $V_{DD}$ into an oscillating power signal (preferably a high-frequency oscillating power signal) and outputs the oscillating power signal through the ports $TX_P$ and $TX_N$ to the primary coil L P of the RDL-based micro-transformer 100. The receiving chip is connected to the secondary coil $L_S$ of the RDL-based micro-transformer. The receiving chip receives, through the ports $RX_P$ and $RX_N$, the high-frequency oscillating power signal generated by the transmitting chip 200 and transmitted to the secondary coil $L_S$ of the RDL-based micro-transformer 100, rectifies and modulates to stabilize an output voltage $V_{ISO}$. In this process, a control signal for stabilizing the output voltage is generated according to a change of a load, and the control signal is encoded for digital isolation.

Figure 3:
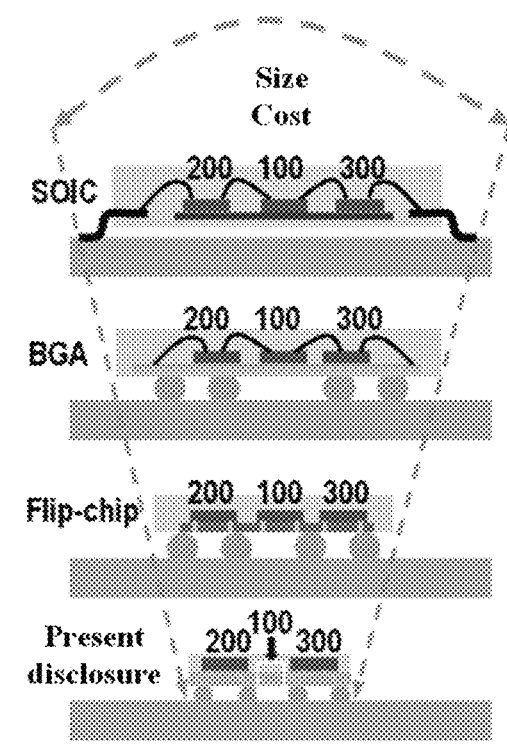
FIG. 3 shows a schematic structural diagram of a comparison between an existing fully integrated isolated power chip and an isolated power chip based on wafer level packaging according to an embodiment of the present disclosure.

According to another aspect of the present disclosure, a method of manufacturing an isolated power chip based on wafer level packaging of a fully integration of an RDL-based micro-transformer and a chip is provided. With reference to FIG. 3, existing fully integrated isolated DC-DC chip packaging schemes include, for example, SOIC scheme, Ball Grid Array (BGA) scheme based on gold wire bonding, and Flip chip scheme based on flip soldering. In above schemes, at least three bare chips are required, including a transmitting chip, a receiving chip and a transformer chip. The transformer chip achieved by the downstream process based on the silicon substrate causes the increase of the package size and cost. A loss of the silicon substrate is relatively high at a high frequency. The parasitic inductance caused by bonding wires has a certain adverse impact on the electrical performances. A wafer level fan-out packaging technology adopted in the present disclosure manufactures the transformer and achieves an interconnection through RDL in the packaging. It needs only two bare chips (transmitting chip and receiving chip) and does not need gold wire bonding, so as to greatly reduce the packaging size and costs, and improve the power density and reliability of a converter. Referring to a schematic structural diagram of the isolated power chip based on wafer level packaging of a fully integration of the RDL-based micro-transformer and the chip shown in FIG. 4a and FIG. 4b, a transformer 100, a transmitting chip 200, a receiving chip 300, a substrate 40, an isolation dielectric 50 and a solder ball 60 of the ball grid array are included in a packaging structure of the isolated power chip provided by the embodiments of the present disclosure.

In embodiments of the present disclosure, with reference to FIG. 4a, FIG. 4b and FIG. 6, a method of manufacturing the isolated power chip based on wafer level packaging described above is provided. The manufacturing method includes operations S1 to S3.

In the operation S1, a transmitting chip and a receiving chip are provided on a substrate.

The above operation S1 includes grooving the substrate and embedding the transmitting chip and the receiving chip into a groove, or attaching the transmitting chip and the receiving chip to an outer surface of the substrate. In embodiments of the present disclosure, a method of grooving the substrate and embedding the chips into a groove is taken as an example for illustration. Two chips are embedded and attached to a grooved substrate 40. A material of forming the substrate is selected form glass, silicon, or FR4.

The transmitting chip 200 and the receiving chip 300 are designed and manufactured using a silicon-based process.

Several pads and circuit regions are formed on an upper surface of the transmitting chip 200 and an upper surface of the receiving chip 300.

In the operation S2, an isolation dielectric and an RDL layer are manufactured on the substrate and the chips, the isolation dielectric and the RDL layer are processed into a micro-transformer, and leading and an interconnection of signal ports are performed.

The RDL layer includes at least one wiring layer, preferably two or three wiring layers. The primary coil of the micro-transformer, the secondary coil of the micro-transformer, and the interconnection structure of the micro-transformer are manufactured through respective wiring layers. In embodiments of the present disclosure, the RDL layer (redistributable layer) includes a first wiring layer RDL1, a second wiring layer RDL2, and a third wiring layer RDL3. The primary coil $L_P$ of the micro-transformer is manufactured through the first wiring layer RDL1; and the secondary coil $L_S$ of the micro-transformer is manufactured through the third wiring layer RDL3. A plurality of first via holes V1 are provided between the chips (transmitting chip, receiving chip) and the first wiring layer RDL1 on the chips. A plurality of second via holes V2 are provided between the second wiring layer RDL2 and the first wiring layer RDL1 and between the second wiring layer RDL2 and the primary coil $L_P$. A plurality of third via holes V3 are provided between the second wiring layer RDL2 and the third wiring layer RDL3 and between the second wiring layer RDL2 and the secondary coil $L_S$. The primary coil is connected to the second wiring layer RDL2 through the second via hole V2, and the primary coil is connected to ports $TX_P$ and $TX_N$ of the transmitting chip 200 through the first via hole V1. The secondary coil is connected to the second wiring layer RDL2 through the third via hole V3, and the secondary coil is connected to ports $RX_P$ and $RX_N$ of the receiving chip 300 through the via holes V2 and V1. The above via holes are conductive via holes.

In this operation, the isolation dielectric 50 plays a supporting and isolating role in the process of manufacturing the micro-transformer.

A material of forming the RDL layer is selected from copper wire, aluminum wire, or gold wire, etc. A material of forming the isolation dielectric layer is selected from glass, silicon, FR4, polyimide, epoxy resin, or plastic, etc.

In the operation S3, an external interface is manufactured on a surface of the micro-transformer to complete a manufacture of the isolated power chip based on wafer level packaging.

BGA solder ball 60 is manufactured on the third wiring layer RDL3 as an external interface, and a via hole V4 is provided between the solder ball and the third wiring layer RDL3. The BGA solder ball includes any one of tin balls, nickel palladium gold balls, or nickel balls, etc.

As the RDL-based micro-transformer 100 is manufactured in different chip layers, and the isolated power chip proposed in the present disclosure eliminates at least one transformer chip, the micro-transformer is manufactured through the RDL layer. A thickness of the RDL layer may be increased by a thickness of the manufactured metal wire, a line width may be widened, so as to effectively improve a Q value of the transformer. Therefore, the design space for parameters such as the inductance value and the Q value of the transformer becomes larger.

The Q value and the coupling coefficient of the transformer are directly proportional to the transmission efficiency. Under a constraint of size, by optimizing parameters of a coil of the transformer, such as inner diameter R, the number of turns N, a line spacing s, a line width w, and a line thickness t, a spacing h between the primary coil of the transformer and the secondary coil of the transformer may be determined according to pressure resistance characteristics of the adopted dielectric material. An optimal transmission efficiency is achieved within a resonant frequency range of the isolated power supply.

In embodiments of the present disclosure, the resonant frequency of the isolated power supply is $f=\frac{1}{2\pi\sqrt{LC}}$, where C is a gate equivalent capacitance of the first MOS transistor and the second MOS transistor in the cross-coupled oscillator 210, and L is an equivalent inductance of the micro-transformer.

Figure 5:
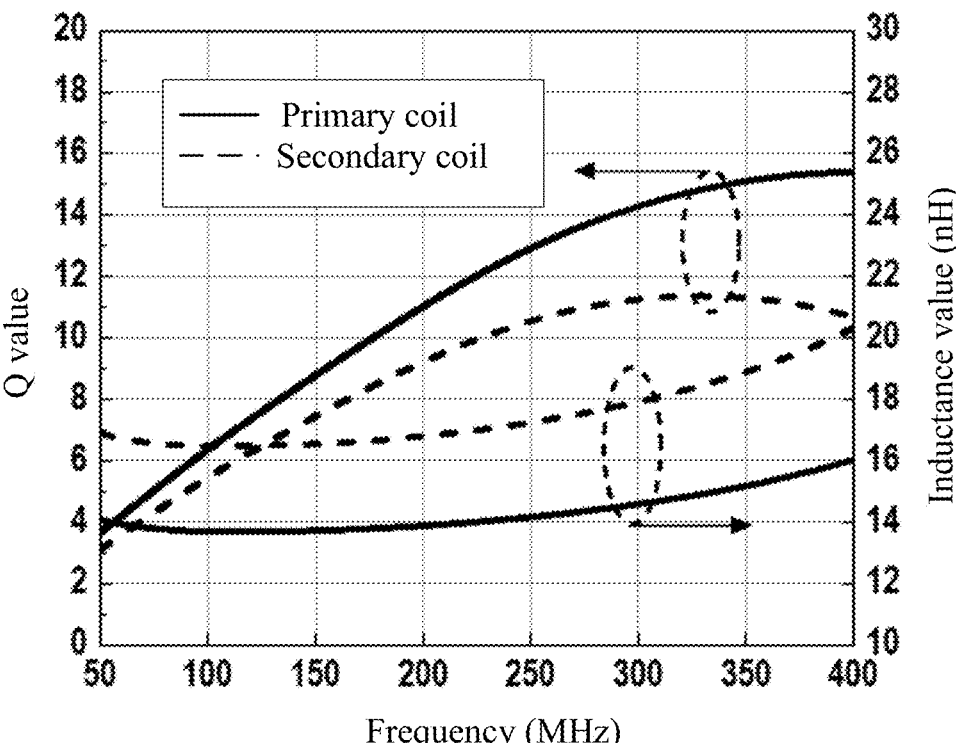
FIG. 5 shows a schematic diagram of a simulation result of Q value of a micro-transformer in an isolated power chip based on wafer level packaging according to an embodiment of the present disclosure.

In a specific implementation of the present disclosure, within an area of 2 mm×4 mm, an RDL-based micro-transformer is manufactured. Specific parameters of the RDL-based micro-transformer are R=880 μm, N=3.5, s=80 μm, w=100 μm, t=10 μm and h=30 μm. Through electromagnetic simulation software, as shown in FIG. 5, the Q value of the primary coil of the transformer in a range of 180 to 210 MHz is 11.6 and the Q value of the secondary coil of the transformer in a range of 180 to 210 MHz is 9.6, which is significantly higher than the Q value, which is 6.8 at 200 MHz, of the chip transformer in the reference.

Embodiments of the present disclosure have been described in detail with reference to the accompanying drawings. It should be noted that, in the accompanying drawings or in the text of the specification, implementations that are not shown or described are forms known to those of ordinary skilled in the art, and are not described in detail. In addition, the above definitions of each element and method are not limited to the various specific structures, shapes or methods mentioned in the embodiments, and those skilled in the art may easily modify or replace them. For example, in embodiments, the first wiring layer RDL1, the second wiring layer RDL2, and the third wiring layer RDL3 are used to manufacture the transformer and the interconnection lines only for illustrating specific implementation manners of the present disclosure. Other implementations based on the inventive concept of the present disclosure should be covered within the scope of protection of the present application, for example, the primary coil L P and the secondary coil $L_S$ are manufactured through the second wiring layer RDL2 and the third wiring layer RDL3, respectively, or two-layer wiring Layer, four-layer wiring layer and other ways to implement the manufacturing of the micro-transformer.

It is worth mentioning that the substrate in the present disclosure may preferably be made of glass material. As the tangential loss angle of the glass substrate is 2 to 3 times smaller than that of the existing silicon substrate. The in-package transformer designed through the three-layer RDL in packaging has high Q and coupling coefficient, so that more than 1 W of power may be transmitted with high efficiency.

In addition, the above definitions of each element and method are not limited to the various specific structures, shapes or methods mentioned in the embodiments, and those of ordinary skilled in the art may easily modify or replace them, for example: (1) the planar transformer 100 may be implemented by a coil with a double helix; alternatively, the planar transformer 100 may be implemented by a polygon coil with a single helix or a multi-helix; and (2) a material of the filled isolation dielectric 50 may also be replaced with a same material as the substrate to achieve complete embedded packaging.

The specific embodiments described above have further described the purpose, technical solutions and beneficial effects of the present disclosure in detail. It should be understood that the above descriptions are only specific embodiments of the present disclosure, and are not intended to limit the present disclosure. Within spirit and principle of the present disclosure, any modifications, equivalent replacements, improvements, etc., shall be included in the scope of protection of the present disclosure.

Based on the above description, those of ordinary skilled in the art should have a clear understanding of the isolated power chip based on wafer level packaging and the method of manufacturing the isolated power chip based on wafer level packaging of the present disclosure.

In summary, the present disclosure provides an isolated power chip based on wafer level packaging and a method of manufacturing the same. A new solution of the isolated power chip is provided, in the new solution, a wafer level packaging method is adopted, the transmitting and receiving chips and the RDL-based micro-transformer are embedded and integrated on the substrate, thereby reducing costs, reducing packaging size, and improving the power density of the isolated power supply. Moreover, in the solution provided by the present disclosure, a single transformer chip is not required, and the micro-transformer is manufactured through the RDL in packaging, so that based on the compact RDL and high-performance metal lines, the RDL-based micro-transformer with the higher quality factor (Q) and coupling coefficient is implemented, so as to improve a transmission efficiency of the transformer, thereby further improving the power conversion efficiency of the isolated power supply. Moreover, in the proposed solution, the existing gold wire bonding is replaced by RDL interconnection, so as to further reduce the packaging size, thereby avoiding an instability of the system caused by the parasitic inductance which is caused by bonding wires, and shortening a return path from the power supply to the ground to reduce some electromagnetic noises. The isolated power chip provided by the present disclosure may be applied in size-constrained and cost-constrained application scenarios, so as to efficiently transmit watt-level power and have higher efficiency.

Those of ordinary skilled in the art may clearly understand that, for the convenience and brevity of the description, the division of the above-mentioned functional devices is only used as an example for illustration. In practice, the above functional allocation may be completed by different functional modules as required, that is, the internal structure of the chip is divided into different functional modules to complete all or part of the functions described above. The specific operating process of the chip described above may refer to the corresponding process in the foregoing method embodiments, which are not repeated here.

It should be noted that the above embodiments are only used to illustrate the technical solutions of the present disclosure, which is not to limit them. Although the present disclosure has been described in detail with reference to the foregoing embodiments, those of ordinary skilled in the art should understand that it is still possible to modify the technical solutions described in the foregoing embodiments, or perform equivalent replacements for some or all of the technical features. In a case of non-conflicting, the features in the embodiments of the present disclosure may be arbitrarily combined. However, these modifications or replacements do not make the essence of the corresponding technical solutions depart from the scope of the technical solutions of the embodiments of the present disclosure.

What is claimed is:

1. An isolated power chip based on wafer level packaging, comprising:

an RDL-based micro-transformer, wherein a primary coil of the RDL-based micro-transformer is connected to a direct-current power supply and configured to output a direct-current voltage input by the direct-current power supply;

a transmitting chip connected to the primary coil of the RDL-based micro-transformer, and configured to receive the direct-current voltage, convert the direct-current voltage into an alternating current signal, and transmit the alternating current signal to a secondary coil of the RDL-based micro-transformer; and a receiving chip connected to the secondary coil of the RDL-based micro-transformer, and configured to convert the alternating current signal into a direct-current signal, generate a control signal for stabilizing the output voltage according to a change of a load, and encode the control signal for digital isolation.

2. The isolated power chip of claim 1, wherein the RDL-based micro-transformer comprises:

the primary coil processed based on the RDL;

the secondary coil processed based on the RDL; and an interconnection line, comprising:

an interconnection line leaded from a side of the primary coil, connected to a port of the transmitting chip and manufactured based on the RDL, and an interconnection line leaded from a side of the secondary coil, connected to a port of the receiving chip and manufactured based on the RDL.

3. The isolated power chip of claim 2, wherein a coil winding structure of the primary coil is a single helix or a double helix, and a coil winding structure of the secondary coil is a single helix or a double helix;

the primary coil and the secondary coil are in a same plane or correspond to different planes stacked in parallel; and a coil winding shape of the primary coil and a coil winding shape of the secondary coil comprise: a circle, an ellipse, a rectangle, a regular N-gon, where $N \geqslant 4$.

4. The isolated power chip of claim 1, wherein the transmitting chip 200 comprises:

a cross-coupled oscillator; and a decoding circuit, configured to decode an encoded control signal into a switch signal to control the cross-coupled oscillator to be turned on or turned off.

5. The isolated power chip of claim 4, wherein the cross-coupled oscillator comprises:

a first MOS transistor and a second MOS transistor, wherein a gate of the first MOS transistor is connected to a drain of the second MOS transistor through a first voltage-dividing capacitor, and a gate of the second MOS transistor is connected to a drain of the first MOS transistor through a second voltage-dividing capacitor;

a direct-current bias voltage, wherein one terminal of the direct-current bias voltage is connected to the gate of the first MOS transistor through a first bias resistor; and the other terminal of the direct-current bias voltage is connected to the gate of the second MOS transistor through a second bias resistor; and a switch MOS transistor, wherein a drain of the switch MOS transistor is connected to a source of the first MOS transistor and a source of the second MOS transistor, a source of the switch MOS transistor is grounded, and a gate of the switch MOS transistor is connected to an output terminal of the decoding circuit.

6. The isolated power chip of claim 1, wherein the receiving chip comprises:

a rectification circuit; and a feedback control circuit, wherein the feedback control circuit comprises:

a feedback controller configured to generate the control signal for stabilizing the output voltage according to a change of a sampled output voltage and encode the control signal, wherein a control mode adopted by the feedback controller comprises: a control mode based on a pulse-width modulation, a control mode based on a pulse-frequency modulation, or a combination of the control mode based on the pulse-width modulation and the control mode based on the pulse-frequency modulation; and a digital transformer, wherein an encoded control signal is transmitted in digital isolation through an input port of the digital transformer, and another input port of the digital transformer is a second grounding terminal, wherein a first output port of the digital transformer is connected to the transmitting chip through the RDL, and a second output port of the digital transformer is connected to a first grounding terminal.

7. A method of manufacturing the isolated power chip based on wafer level packaging of claim 1, comprising:

an operation S1, comprising providing a transmitting chip and a receiving chip on a substrate;

an operation S2, comprising manufacturing an isolation dielectric and an RDL layer on the substrate and the chips, processing the isolation dielectric and the RDL layer into a micro-transformer, and performing leading and an interconnection of signal ports; and an operation S3, comprising manufacturing an external interface on a surface of the micro-transformer to complete a manufacture of the isolated power chip based on wafer level packaging.

8. The method of claim 7, wherein the providing comprises:

grooving the substrate and embedding the chips into a groove; or attaching the chips to an outer surface of the substrate, wherein a material of forming the substrate is selected from glass, silicon, or FR4; a material of forming the RDL layer is selected from copper, aluminum, or gold; and a material of forming the isolation dielectric layer is selected from glass, silicon, FR4, polyimide, epoxy resin, or plastic.

9. The method of claim 8, wherein the RDL layer comprises at least one wiring layer, and wherein the primary coil of the micro-transformer, the secondary coil of the micro-transformer, and the interconnection structure of the micro-transformer are manufactured through respective wiring layers.

10. The method of claim 9, wherein the RDL layer comprises a first wiring layer, a second wiring layer and a third wiring layer, the primary coil of the micro-transformer is manufactured through the first wiring layer; and the secondary coil of the micro-transformer is manufactured through the third wiring layer, a plurality of first via holes are provided between the chips and the first wiring layer on the chips, a plurality of second via holes are provided between the second wiring layer and the first wiring layer and between the second wiring layer and the primary coil, and a plurality of third via holes are provided between the second wiring layer and the third wiring layer and between the second wiring layer and the secondary coil, the primary coil is connected to the second wiring layer through the second via hole, and the primary coil is connected to a port of the transmitting chip through the first via hole, and the secondary coil is connected to the second wiring layer through the third via hole, and the secondary coil is connected to a port of the receiving chip through the second via hole and the first via hole.

\* \* \* \* \*